May 27, 1969 W. H. GROTH 3,447,149

DIGITAL TO ANALOG CONVERTER

Filed Oct. 18, 1965

INVENTOR.
WILLIAM H. GROTH

BY Arthur H. Swanson

ATTORNEY.

United States Patent Office 3,447,149
Patented May 27, 1969

3,447,149

DIGITAL TO ANALOG CONVERTER

William H. Groth, Douglasville, Pa., assignor to Honeywell Inc., Minneapolis, Minn., a corporation of Delaware Filed Oct. 18, 1965, Ser. No. 497,369
Int. Cl. H03k 13/02
U.S. Cl. 340—347 8 Claims

ABSTRACT OF THE DISCLOSURE

There is provided a digital to analog converter circuit utilizing a pair of counters which are driven by a pulse source. The rate of counting by one of the counters is selectively variable. The difference in the counts of the counters controls an analog output producing circuit.

This invention relates to data-handling apparatus. More specifically, the present invention relates to digital to analog converters.

An object of the present invention is to provide an improved high speed digital to analog converter.

Another object of the present invention is to provide an improved digital to analog converter for providing a continuous and bidirectionally variable analog output signal representative of a digital input signal.

A further object of the present invention is to provide an improved digital to analog converter directly operable by a digital computer and having means to limit the conversion to the available analog signal range.

Still another object of the present invention is to provide an improved digital to analog converter, as set forth herein, having a simple operation and construction.

In accomplishing these and other objects, there has been provided, in accordance with the present invention, a digital to analog converter comprising a first binary counter, a second binary counter and a clock directly driving the first counter and selectively driving the second counter through gates controlled by input digital command signals. The difference in count between the counters is used to produce a pulse train having pulses whose duration is varied by the count difference. These pulses are integrated and amplified to produce an analog output signal. Limit logic circuits are used to control the analog output signals at its maximum and minimum values independent of the presence of contrary input digital commands.

A better understanding of the present invention may be had when the following detailed description is read in connection with the accompanying drawings in which.

Figures 1, 2:
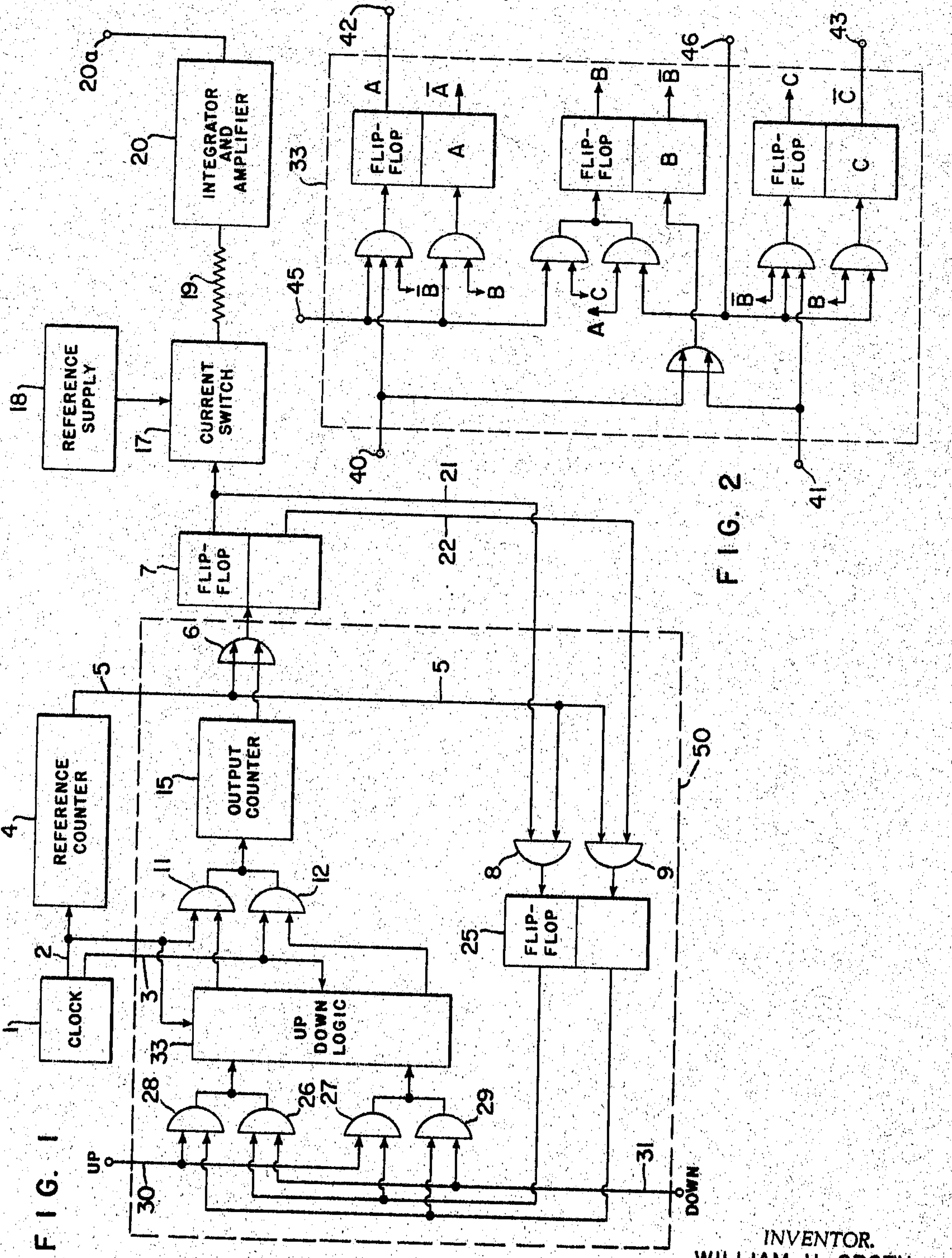
FIG. 1 is a schematic representation of a digital to analog converter embodying the present invention.
FIG. 2 is a schematic illustration of an up-down logic circuit suitable for use in FIG. 1.

Referring to FIG. 1 in more detail, there is shown a digital to analog converter, hereinafter referred to as a D/A converter, comprising a clock, or free-running oscillator, 1 arranged to produce as pulse train at a predetermined frequency; e.g., one megacycle. A high frequency clock signal tends to reduce the ripple content at the analog output. The output signals from the clock 1 are arranged to alternate between a pair of clock output lines 2, 3, at the aforesaid frequency. Thus, the signal produced on line 3 is the complement of the signal produced on line 2. A first clock output line 2 is connected to the input circuit of a reference binary counter 4. This counter may be any standard counter known in the art. For example, the counter may include one or more known types of flip-flop circuits. The output circuit of the counter 4 is arranged to produce an output signal for each full binary count; e.g., a count of 1,024 input pulses. This output signal is applied over line 5 to an "or" gate 6. An output signal from gate 6 is fed to a first flip-flop 7 to switch the flip-flop 7 between its alternate states. Typically, the flip-flops described may be, but are not limited to, A.C. flip-flops which trigger on the trailing edge of the input signal. Also, the reference counter output signal is connected over line 5 to a first and a second "and" gate 8 and 9 as a first input signal thereto.

The first clock line 2 is, also connected to a third "and" gate 11 as a first input signal thereto. The second clock output line 3 is connected to a fourth "and" gate 12 as a first input signal thereto. The output signals from the "and" gates 11, 12 are connected together and are applied to the input circuit of a second binary counter 15 similar to the first counter 4. That is, counter 15 produces an output signal for a full binary count which may be 1,024 as in the case of counter 4. An output signal from the second binary counter 15 is connected to an input to "or" gate 6 and, from gate 6, is applied to flip-flop 7. The output signal from one side (e.g.) of the first flip-flop 7 is connected to a current switch, or gate, 17 which is effective to supply a predetermined and substantially constant amplitude signal from a reference supply 18. This signal is applied through a resistor 19 to an averaging or integrating, and amplifying circuit 20. The output signal from the averaging circuit 20 is applied to an averaging output terminal **20*a* as an analog output signal. Thus, the analog output signal is a direct function of the duration of the constant amplitude signal produced by reference supply 18. The duration of the signal is controlled by flip-flop 7** as is described hereinafter.

The output signal from the first side of a flip-flop 7 is, also, applied as a second input signal to the first "and" gate 8 over line 21. Similarly, the output signal from the second (e.g. Reset) side of the flip-flop 7 is applied as a second input signal to the second "and" gate 9 over line 22. The output signals from the "and" gates 8, 9 are applied to opposite input sides of a second flip-flop 25. The output signals from the respective sides of second flip-flop 25 are applied as first input signals to respective fifth and sixth "and" gates 26, 27 from one side of flip-flop 25 and seventh eighth "and" gates 28, 29 from the other side of flip-flop 25. The second input signal for the sixth and seventh "and" gates 27, 28 is obtained from a digital signal input line 30 indicated operatively as an "up" line. Similarly, the second input signal for the fifth and eighth "and" gates 26, 29 is obtained from a digital signal input line 31 operatively labeled as a "down" line. The "up" and "down" signals may be provided by any suitable control means.

The output signals from the fifth and seventh "and" gates 26, 28 are both connected to a first input circuit of an up-down logic circuit 33. The output signals from the sixth and eighth "and" gates 27, 29 are both connected to a second input circuit of the logic circuit 33. The up-down logic circuit 33 is used to control the third and fourth "and" gates 11, 12 to selectively gate the clock signals on the clock line 2 or 3 to the counter 15. In other words, the output signals from the up-down logic circuit 33 are applied as second input signals to "and" gates 11 and 12, respectively, to determine which of these gates is conductive. The condtion of gates 11 and 12 determines which of the signals on clock line 2 or 3 are introduced into counter 15. The clock lines 2, 3 are, also, connected to provide synchronizing signals to the logic circuit 33. A suitable logic circuit for use as the up-down control 33 is shown in FIG. 2. A first input terminal 40 is provided for connection to the gates 26 and 28. A second input terminal 41 is connected to the gates 27 and 29. A pair of output terminals 42 and 43 are connected to the gates 12 and 11, respectively. A first synchronizing terminal 45 is provided for connection to the first clock line 2 while a second synchronizing terminal 46 is connected to the second clock line 3. The synchronizing connections are utilized to accurately control the number of clock pulses operated on during an up or down input signal. For purposes of clarity, a number of the internal connections of FIG. 2 have been indicated with letters as the destination of these connections on the three flip-flops A, B and C.

In operation, the D/A converter of the present invention is effective to convert a digital signal comprising a train of pulses to an analog output signal which can be used to perform direct adjustments of analog devices. Thus, the present invention is effective to allow a digital computer to control analog process control devices; e.g., valves, by effecting a continuous digital to analog conversion. The present invention is, also, arranged to act bidirectionally to enable the analog output signal to be either increased or decreased, as desired, in order to continuously respond to digital input commands. Basically, the D/A converter is arranged to produce an analog output signal on terminal 20*a* which represents the difference in count between the counters 4 and 15. These counters are normally arranged to count the clock pulses from the clock 1 on line 2. These pulses are fed directly to the reference counter 4 on line 2 and through a normally open gate; i.e., gate 11, to the output counter 15. At the end of each full cycle binary count, the counters 4, 15 are each effective to produce an output signal which is passed through "or" gate 6 to the flip-flop 7. Since the output of the "or" gate 6 is applied to the complementing, or toggle, input of the flip-flop 7, each pulse output from the gate 6 is effective to change the state of the flip-flop 7. The output signal in the form of a pulse train from one side of the flip-flop 7 is applied to a current switch 17 to allow a substantially constant amplitude current flow from the reference supply 18 to the integrator 20 during the duration of each flip-flop pulse. The integration and amplification of this current flow by the integrator 20 is effective to produce a continuous analog output signal on the output terminal 20*a*. Thus, the continuing pulse train from the flip-flop 7 is effective to maintain a corresponding analog signal output from the integrator 20. That is, in the absence of a change in the pulse rate from flip-flop 7, the analog output signal remains constant.

In order to change the analog output signal in response to digital input commands on either the "up" terminal 30 or the "down" terminal 31, the D/A converter is provided with means to change the count in the output counter 15 with respect to the reference counter 4. This count change is achieved by either adding a pulse to the output counter 15 on line 3 or preventing a pulse on line 2 from reaching the counter 15. Under either of these conditions, the output signal from the output counter 15 shifts in time relation with respect to the output signal from the reference counter 4. Thus, the flip-flop 7 is actuated at different times to change its state from the previous times whereby the duration of the pulses in the pulse train supplied to the integrator 20 is varied. Specifically, if a pulse is added to the output counter 15, the count cycle is completed sooner. Therefore, the duration of the pulse supplied to integrator 20 is decreased since the flip-flop 7 is switched sooner and switch 17 is closed sooner. This decrease in pulse duration is effective to proportionally decrease the analog output signal. On the other hand, if an input pulse is deleted from the output counter 15, the flip-flop 7 is switched later, and the analog output signal is increased. It will be noted that the addition or deletion of a single pulse to the counter (1,024 counts) permits a step or change having about 0.1% full-scale resolution.

The alternate clock line 3 is used as a supply of additional pulses to the output counter 15 through gate 12. Gate 11 is used to delete a clock pulse on line 2 from the output counter 15. These gates are controlled by the up-down logic 33 in response to digital commands on either input terminal 30 or 31. The up-down logic 33 is a conventional resetting logic circuit which is normally effective to allow gate 11 to be opened and all clock pulses on line 2 to be applied to the output counter 11. A suitable logic circuit employing conventional elements is shown in FIG. 2. This logic circuit is normally arranged to hold gate 11 in an open condition by having an output $\overline{C}$ from flip-flop C appear on the side connected to gate 11. Flip-flop A is used to control the opening of gate 12 to add an additional pulse from line 3 to the output counter 15 to decreases the analog signal. The up-down logic 33 is arranged to reset itself to either reopen gate 11 or to reclose gate 12 after the desired action has been achieved in response to a prior digital command. This resetting action allows clock pulses on line 2 to be reapplied to the output counter 15.

The gates 8, 9 the flip-flop 25 and the gates 26, 27, 28 and 29 are arranged as a logic circuit to effect an end stop when the analog output signal has reached a maximum excursion in either an increase or decrease direction. Such a maximum excursion would be indicated by a reversal of the effect of the output signals from the counters 4 and 15; i.e., the reference counter 4 would be turning on the pulses in the pulse train supplied by the flip-flop 7 and the output counter 15 would be turning off these pulses. That is, counter 15 would have decremented to the point where it had fallen behind counter 4 and the actual "subsequent pulse" would appear as a virtual "prior pulse." This reversal would result in further digital decrease commands resulting in an increase in the analog output signals and vice versa. The aforesaid logic components are used to detect this condition and to reverse the effect of the up-down digital commands whereby the analog signal would substantially remain at its maximum excursion. Specifically, the digital commands would have a reverse effect as soon as a maximum excursion was reached to reverse the course of the analog signal and a normal condition would be reinstated when less than a limit condition was present. The reversed state would then be provided if the limit value; i.e., either maximum or minimum, was again passed. Thus, the analog output signal would be kept at its limit value with a small deviation to one side while the digital commands could continue to direct a change after the limit was reached without any further effect. To effect this operation, gate 8 is used to sense the presence of an output signal on line 5 at the same time that flip-flop 7 is "on." This coincident condition is used to trigger flip-flop 25 in order to divert the "up" digital commands on line 30 to the up-down logic 33 by enabling gate 27 in place of the "down" commands. The restoring of the "up" commands to the normally up side of the up-down logic 33 is performed by gate 9 triggering flip-flop 25 to its opposite state to open gtae 28. Gate 9 is enabled by the concurrent application of input signals thereto by counter 4 (via line 5) and the second, or Reset, side of flip-flop 7. Similarly, the "down" digital commands are interchanged through gaes 26 and 29 under the control of flip-flp 25.

Accordingly, it may be seen that there has been provided, in accordance with the present invention, a continuous high speed digital to analog converter having limit controls for restricting maximum excursions of the analog signals.

What is claimed is:

1. A digital to analog converter comprising, first counter means, second counter means, clock means producing alternate clock output signals and arranged to continuously drive with one of said output signals said first counter means, signal gate means connected between said clock means and said second counter means to selectively supply said alternate output signals to said second counter means, up-down logic means arranged to be connected to a source of up-down digital command signals and operative to control said signal gate means in response to said input digital command signals applied thereto, means responsive to the time of the end of count cycles in said first and said second counter means to produce a pulse train having a pulse train having a pulse duration proportional to the difference in time represented by the end of count cycle of said first counter means with respect to the end of count cycle of said second counter means, integrating means arranged to integrate said pulse train to produce an analog output signal, and limit means connected between said source of up-down digital commands and said up-down logic means to detect a limit excursion of said analog output signal and to reverse the effect of said digital command signals and said up-down logic means in order to nullify an attempt to produce an over-limit analog output signal.

2. A digital to analog converter as set forth in claim 1 wherein said signal gate means includes first means to normally apply one of said alternate clock signals to said second counter and to delete one of said alternate clock signals under control of said up-down logic means, and second means to apply the other one of said alternate clock signals to said second counter under control of said up-down logic means between the clock signals from said first means.

3. A digital to analog converter comprising a first counter, a second counter, a clock means having alternate clock output signals, first gate means arranged to selectively apply a first one of said alternate clock signals to said second counter, second gate means arranged to selectively apply a second one of said alternate clock signals to said second counter, up-down logic means connected between said first gate and said second gate and a source of input up-down digital command signals to selectively open and close said first and second gates, means connecting one of said clock output signals directly to said first counter, means responsive to the time of the end of count cycles in said first and said second counters to produce a pulse train having a pulse duration proportional to the difference in time represented by the end of count cycle of said first counter with respect to the end of count cycle of said second counter, and integrating means arranged to integrate said pulse train to produce an analog output signal.

4. A digital to analog converter comprising, a source of regularly recurring signals, first and second means for counting the signals produced by said source of regularly recurring signals, said first means for counting connected directly to said source of regularly recurring signals, bistable switching means connected to said first and second means for counting, said bistable means having the state thereof switched by each signal produced by each of said counting means, current supplying means connected to said bistable means, said current supplying means being rendered electrically conductive when said bistable means is in a first stable state, and means for selectively adding or deleting a clock pulse to said second counting means in order to vary the counting thereof, said last named means being connected to and controlled by said first counting means and said bistable switching means when said bistable switching means is in a second stable state.

5. The digital to analog converter recited in claim 4 wherein said source of regularly recurring signals provides the regularly recurring signals and the complements thereto, said means for adding or deleting signals to said second counting means being connected to said source of regularly recurring signals whereby synchronization is achieved.

6. The digital to analog converter recited in claim 4 including means for reversing the operation of said means for adding or deleting a signal at said second counting means.

7. The digital to analog converter recited in claim 6 wherein said means for reversing includes a bistable device for producing two output signals and said means for selectively adding or deleting a clock pulse includes a plurality of gate means, said bistable device being connected to said gate means.

8. The digital to analog converter recited in claim 1 wherein said up-down logic means comprises a plurality of bistable devices and a plurality of gate means, said gate means providing switching signals to the bistable devices associated therewith, said bistable devices being connected to inputs of gate means associated with others of said bistable devices, said bistable devices selectively supplying control signals to said signal gate means.

References Cited

UNITED STATES PATENTS

| | | | |
|---|---|---|---|
| 3,258,667 | 6/1966 | McDonough et al. | 340—347 X |
| 3,263,066 | 7/1966 | Seegmiller | 235—150.5 |
| 3,264,457 | 8/1966 | Seegmiller et al. | 340—347 X |

OTHER REFERENCES

Susskind, A. K.: Notes on Analog-Digital Conversion Techniques, 1957, pp. 5–23 through 5–27.

MAYNARD R. WILBUR, *Primary Examiner.*

M. K. WOLENSKY, *Assistant Examiner.*

U.S. Cl. X.R.

235—92, 154